United States Patent [19]

Yahalom

[11] 4,299,670
[45] Nov. 10, 1981

[54] PALLADIUM PLATING PROCEDURE AND BATH

[75] Inventor: Joseph Yahalom, Summit, N.J.

[73] Assignee: Bell Telephone Laboratories, Incorporated, Murray Hill, N.J.

[21] Appl. No.: 189,725

[22] Filed: Sep. 22, 1980

[51] Int. Cl.³ .................... C25D 3/52; C25D 5/34
[52] U.S. Cl. ..................................... 204/29; 204/47
[58] Field of Search ............... 204/47, 43 N, 109, 29

[56] References Cited

U.S. PATENT DOCUMENTS

| | | |
|---|---|---|
| 1,921,941 | 8/1933 | Powell et al. ................. 204/47 |
| 1,970,950 | 8/1934 | Wise ........................... 204/47 |
| 1,981,715 | 11/1934 | Atkinson ..................... 204/47 |
| 1,993,623 | 3/1935 | Raper .......................... 204/47 |
| 2,452,308 | 10/1948 | Lambros ...................... 204/47 |
| 3,150,065 | 9/1964 | Fatzer ......................... 204/47 |
| 3,458,409 | 7/1969 | Hayashi et al. ............. 204/43 N |
| 3,544,435 | 12/1970 | Angus et al. ................ 204/47 |
| 3,920,526 | 11/1975 | Caricchio et al. ............ 204/47 |

Primary Examiner—G. L. Kaplan
Attorney, Agent, or Firm—Walter G. Nilsen

[57] ABSTRACT

A process for electrodepositing palladium. The article to be coated is exposed to a benzotriazole compound for preventing interference by copper ions in the plating bath. The article may be exposed either by a predip in a solution comprising a benzotriazole compound or the compound may be included in the electroplating bath.

32 Claims, 1 Drawing Figure

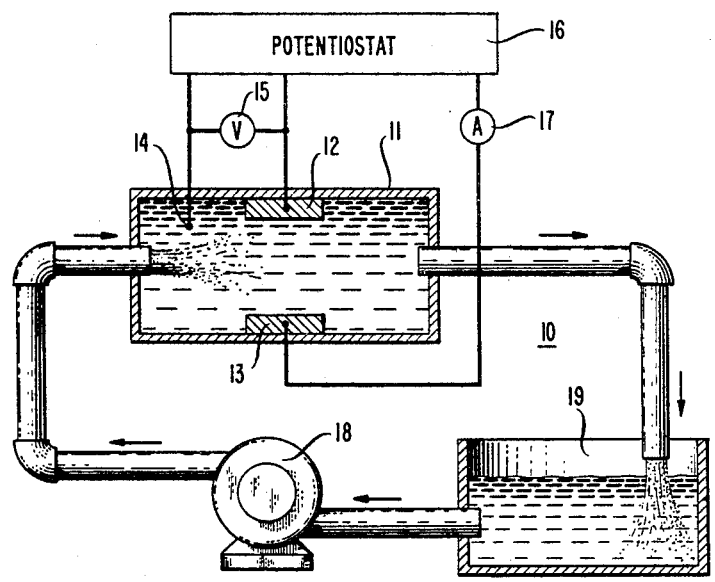

PALLADIUM PLATING PROCEDURE AND BATH

TECHNICAL FIELD

The invention is a process for electroplating palladium and plating bath for electroplating palladium.

BACKGROUND OF THE INVENTION

Palladium and palladium alloys are extensively used in a variety of industrial applications including the fabrication of jewelry, optical devices, and electronic circuits and devices. Palladium and its alloys are attractive because of chemical inertness, surface luster, high electrical conductivity, and excellent surface properties, particularly for electrical contacts. In many applications, chemical inertness is highly advantageous for long life and high reliability. This is particularly true for applications in electrical and electronic devices.

Because of chemical inertness and reasonable surface hardness, palladium is especially attractive as an electrical contact material in electrical connectors, relay contacts, switches, etc. Various palladium alloys such as palladium silver are also useful for the same applications. Indeed, because of the increasing cost of gold, palladium becomes more and more attractive economically as a contact material, surface material, and in other applications. In many applications where gold is used, it is often economically attractive to use palladium, provided an inexpensive and efficient method of plating ductile and adherent palladium is available.

Highly desirable is a process for plating palladium from an aqueous solution which is highly reliable despite the possible introduction of foreign ions into the bath which might adversely affect the plating process. This is most critical in plating various types of electrical connectors (switches, relays, etc.) and other electrical devices because of the possibility of introducing copper ions into the plating bath.

Palladium electroplating processes and baths have been described in a number of references including U.S. Pat. No. 1,970,950, issued to E. M. Wise on Aug. 21, 1934 and U.S. Pat. No. 1,993,623, issued to A. R. Raper on Mar. 5, 1935.

SUMMARY OF THE INVENTION

The invention is a process and bath composition for electroplating palladium. The process is carried out in an ammoniacal aqueous bath containing an amine palladium complex and benzotriazole or a benzotriazole derivative. It is preferred that the benzotriazole derivative comprise benzotriazole compounds with inert substituents on at least one of the 4, 5, 6 and 7 positions on the benzene ring, typically hydrocarbon substituents up to 5 carbon atoms, chlorine, bromine and nitrate groups. Typical examples are 5-methylbenzotriazole, 5-chlorobenzotriazole, 5-bromobenzotriazole and 5-nitrobenzotriazole. Most preferred are unsubstituted benzotriazole and alkane substituents with up to 5 carbon atoms. Such palladium plating processes and baths yield excellent results even where palladium is plated on copper or copper alloys or where copper is somehow exposed to the plating solution. The process and bath are ideal for use on electrical contact surfaces (switches, relays, connectors) where copper or copper alloy is extensively used.

BRIEF DESCRIPTION OF THE DRAWING

The FIGURE shows a typical plating apparatus useful for plating palladium.

DETAILED DESCRIPTION

For convenience, the structural formula for benzotriazole is set forth below.

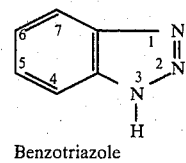

Benzotriazole

The invention in its broadest terms is the use of benzotriazole and derivatives of benzotriazole (collectively referred to as benzotriazole compound) to prevent interference in palladium electroplating processes by introduction of copper ions into the plating bath. Benzotriazole is useful as are many derivatives, particularly those with relatively inert (alkane, halide, etc.) substituents attached to at least one of the benzene ring (4, 5, 6 and 7) positions. More than one compound may be used. Concentration of the benzotriazole compound may vary from 0.1 mg/l to saturation. Preferred is a range from 2 mg/l to 20 mg/l. Less than 2 mg/l gives protection for an inconveniently short time; over 20 mg/l does not materially increase the protection or time of protection and is wasteful of material. The benzotriazole compound may be added to the palladium bath and the palladium plating process carried out in the presence of the benzotriazole or the benzotriazole compound applied to the surface to be plated before exposure to the plating bath.

In broad terms, the electroplating bath should contain a source of palladium in an amine complex and some free ammonia to adjust the pH and stabilize the palladium amine complex.

The concentration of palladium may vary over large limits provided plating takes place. Concentration ranges (in terms of palladium metal) between one mg/l and saturation are useful but more usually the concentration range is between 10 g/l and saturation. For certain applications, especially where rapid plating is desirable, a concentration range between 50 g/l or even 100 g/l and saturation is preferred. Economic considerations often limit the concentration rather than plating considerations. Conducting salts are often added such as ammonium chloride, ammonium phosphate, ammonium sulfamate, ammonium formate, ammonium sulfate, ammonium carbonate, etc. Aqueous ammonia is added to adjust pH and stabilize the palladium complex.

The pH may vary over large limits but is typically between 7 and 12, with 8–10 preferred. Such a pH range stabilizes the palladium—amine complex, yields high plating rates with good adhesion and minimizes attack on the substrate being plated. Stirring or agitation of the bath is usually beneficial, particularly for higher plating rates. The pH is adjusted by the addition of aqueous ammonia solution.

Some typical ammoniacal palladium baths are as follows:

EXAMPLE 1

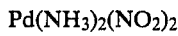
Pd(NH$_3$)$_2$(NO$_2$)$_2$

Benzotriazole compound
NH$_4$NO$_3$ (optional)
NaNO$_2$ (optional)
Aqueous ammonia to pH 8-10

EXAMPLE 2

Pd(NH$_3$)$_4$(NO$_3$)$_2$
Benzotriazole compound
Conducting salts (optional)
Aqueous ammonia to pH 7-10

EXAMPLE 3

Pd(NH$_3$)$_2$Cl$_2$
Benzotriazole compound
Ammonium salts (optional)
Aqueous ammonia to pH 8-12, 8.8 to 9.2 preferred.

EXAMPLE 4

Pd(NH$_3$)$_4$Br$_2$
Benzotriazole compound
Aqueous ammonia to pH 9-10, 9.5 to 10 preferred.

Other palladium complexes such as the corresponding sulfate, phosphate, tartrate, citrate, oxalate and carbonate also may be useful.

The preferred plating bath contains Pd(NH$_3$)$_4$Cl$_2$ as the source of palladium. Amounts of at least 10 g/l (in terms of palladium metal) are preferred with (optionally) various salts such as NH$_4$Cl added as conducting salts. Sufficient aqueous ammonia is added to yield a pH between 8 and 10, preferably 9.0. Higher concentrations of Pd(NH$_3$)$_4$Cl$_2$ are more preferred, say greater than 20 g/l or even 100 g/l. Increased concentration of the palladium complex reduces the amount of conducting salts (i.e., NH$_4$Cl) that can be dissolved in the bath. Indeed, a particular advantage of the invention process is that larger concentrations of palladium species can be used with superior plating results. Where very high concentrations of palladium salt is used, the addition of conducting salt such as NH$_4$Cl may be omitted.

An excellent bath for the practice of the invention is 80 g/l (in terms of Pd metal) of Pd(NH$_3$)$_4$Cl$_2$, 20 mg/l 6-methylbenzotriazole and sufficient aqueous ammonia to pH=9±0.2.

It is contemplated that the bath may be replenished. For example, palladium may be added (either in solid or solution form) as palladium salt (PdCl$_2$) or complex (Pd(NH$_3$)$_4$Cl$_2$). Also, the benzotriazole may be added separately or replenished. Generally, ammonia water is added to stabilize the complex or adjust the pH to a desired range. The bath is usually supplied in solution form but may be supplied either in concentrated form for dilution with water or aqueous ammonia or supplied as solid for dilution to the bath composition.

The compound 2-mercaptobenzothiazole and related compounds and derivatives are also useful in preventing copper poisoning of palladium baths.

The FIGURE is a schematic view of a typical plating apparatus 10, showing plating cell 11 with working electrode 12 and counter electrode 13. Also shown is a reference electrode 14 together with a voltmeter 15 for monitoring the plating potential and a potentiostat 16. The potentiostat supplies sufficient current as measured by the ammeter 17 to maximize plating current without exceeding a predetermined plating potential. Plating solution is pumped into the plating cell 11 by means of a liquid pump 18. A reservoir 19 receives bath solution coming out of the plating cell. Typically, the potentiostat supplies sufficient voltage so that current passes from the working electrode through the plating solution and into the counter electrode. Current is controlled by the potentiostat so as to fix the working electrode potential at a preset value. Naturally, where close control of the working electrode potential is not necessary, the potentiostat can be replaced by a source of electrical energy of sufficiently high voltage and current to carry out the plating procedure.

What is claimed is:

1. A process for plating palladium onto a surface from an aqueous ammoniacal plating bath comprising a source of palladium for electroplating, said source of palladium comprising a palladium amine complexing ion, said process comprising the step of passing current through cathode, plating bath and anode characterized in that the surface is exposed to a solution comprising at least one benzotriazole compound selected from the group consisting of benzotriazole and substituted benzotriazole with substituents in at least one of the 4, 5, 6 and 7 positions of the benzene ring, said substituents selected from the group consisting of hydrocarbons with up to 5 carbon atoms, chlorine, bromine and nitrate groups.

2. The process of claim 1 in which the benzotriazole compound is selected from the group consisting of benzotriazole, 5-methylbenzotriazole, 5-chlorobenzotriazole, 5-bromobenzotriazole and 5-nitrobenzotriazole.

3. The process of claim 1 in which the concentration of the benzotriazole compound in the solution is between 0.1 mg/l and saturation.

4. The process of claim 3 in which the concentration of the benzotriazole compound is between 2 mg/l and 20 mg/l.

5. The process of claim 1 in which the benzotriazole compound is contained in the bath.

6. The process of claim 1 in which the palladium amine complexing ion has a concentration (in terms of palladium metal) between one mg/l and saturation.

7. The process of claim 6 in which the palladium concentration is between 10 g/l and saturation.

8. The process of claim 7 in which the palladium concentration is between 50 g/l and saturation.

9. The process of claim 1 in which the pH is between 7 and 12.

10. The process of claim 9 in which the pH is between 8 and 10.

11. The process of claim 10 in which the pH is 9±0.2.

12. The process of claim 11 in which the plating bath further comprises conducting salts.

13. The process of claim 12 in which the conducting salts are selected from the group consisting of ammonium chloride, ammonium phosphate, ammonium sulfamate, ammonium formate, ammonium sulfate, and ammonium carbonate.

14. The process of claim 1 in which the palladium amine complexing ion is added as a palladium amine compound selected from the group consisting of Pd(NH$_3$)$_2$(NO$_2$)$_2$, Pd(NH$_3$)$_4$(NO$_3$)$_2$, Pd(NH$_3$)$_2$Cl$_2$, Pd(NH$_3$)$_4$Br$_2$ and Pd(NH$_3$)$_4$Cl$_2$.

15. The process of claim 14 in which the plating bath consists essentially of 80 g/l palladium metal added as Pd(NH$_3$)$_4$Cl$_2$, 20 mg/l 5-methylbenzotriazole and sufficient aqueous ammonia to pH=9±0.2.

16. An aqueous palladium electroplating bath comprising a source of palladium for electroplating, said source of palladium comprising a palladium amine complexing ion, and aqueous ammonia characterized in that the palladium electroplating bath further comprises at least one benzotriazole compound selected from the group consisting of benzotriazole and substituted benzotriazole with substituents in the 4, 5, 6 and 7 positions of the benzene ring, said substituents selected from the group consisting of hydrocarbons with up to 5 carbon atoms, chlorine, bromine and nitrate groups.

17. The palladium electroplating bath of claim 16 in which the substituent is an alkyl group with up to 5 carbon atoms.

18. The palladium electroplating bath of claim 17 in which the benzotriazole compound is selected from the group consisting of benzotriazole, 5-methylbenzotriazole, 5-chlorobenzotriazole, 5-bromobenzotriazole and 5-nitrobenzotriazole.

19. The palladium plating bath of claim 16 in which the concentration of the benzotriazole compound in the plating bath is between 0.1 mg/l and saturation.

20. The palladium plating bath of claim 19 in which the concentration of the benzotriazole compound is between 2 mg/l and 20 mg/l.

21. The palladium plating bath of claim 20 in which the palladium amine complexing ion has a concentration (in terms of palladium metal) between one mg/l and saturation.

22. The palladium plating bath of claim 21 in which the palladium concentration is between 10 g/l and saturation.

23. The palladium plating bath of claim 22 in which the palladium concentration is between 50 g/l and saturation.

24. The palladium plating bath of claim 16 in which the pH is between 7 and 12.

25. The palladium plating bath of claim 24 in which the pH is between 8 and 10.

26. The palladium plating bath of claim 25 in which the pH is $9\pm0.2$.

27. The palladium plating bath of claim 26 in which the plating bath further comprises conducting salts.

28. The palladium plating bath of claim 27 in which the conducting salts are selected from the group consisting of ammonium phosphate, ammonium sulfamate, ammonium formate, ammonium sulfate, ammonium carbonate.

29. The palladium plating bath of claim 16 in which the palladium amine complexing ion added as a palladium amine compound selected from the group consisting of $Pd(NH_3)_2(NO_2)_2$, $Pd(NH_3)_4(NO_3)_2$, $Pd(NH_3)_2Cl_2$, $Pd(NH_3)_4Br_2$ and $Pd(NH_3)_4Cl_2$.

30. The palladium plating bath of claim 29 in which the plating bath consists essentially of 80 g/l palladium metal added as $Pd(NH_3)_4Cl_2$, 20 mg/l 6-methylbenzotriazole and sufficient aqueous ammonia to pH=$9\pm0.2$.

31. The palladium bath of claim 16 in which the source of palladium is supplied with a solid palladium compound.

32. The palladium bath of claim 16 in which the benzotriazole compound is supplied in the form of a solid.

* * * * *